(12) United States Patent
Yokoyama et al.

(10) Patent No.: US 6,190,578 B1
(45) Date of Patent: Feb. 20, 2001

(54) ANISOTROPIC CONDUCTIVE COMPOSITION

(75) Inventors: Akinori Yokoyama; Toru Mori, both of Fuji (JP)

(73) Assignee: Asahi Kasei Kogyo Kabushiki Kaisha (JP)

( * ) Notice: Under 35 U.S.C. 154(b), the term of this patent shall be extended for 0 days.

(21) Appl. No.: 09/117,690

(22) PCT Filed: Feb. 7, 1997

(86) PCT No.: PCT/JP97/00318

§ 371 Date: Aug. 4, 1998

§ 102(e) Date: Aug. 4, 1998

(87) PCT Pub. No.: WO97/29490

PCT Pub. Date: Aug. 14, 1997

(30) Foreign Application Priority Data

Feb. 8, 1996 (JP) .................................................. 8-022767
Jun. 20, 1996 (JP) .................................................. 8-159770

(51) Int. Cl.[7] ............................... H01B 1/08; H01B 1/22
(52) U.S. Cl. ........................ 252/512; 252/518.1; 428/209
(58) Field of Search ........................... 428/209; 252/512, 252/514, 518.1, 520

(56) References Cited

U.S. PATENT DOCUMENTS 4,552,690 * 11/1985 Ikeguchi et al. ..................... 252/512
5,198,154 * 3/1993 Yokoyama et al. .................. 252/514
5,242,511 * 9/1993 Yokoyama et al. .................. 148/430

FOREIGN PATENT DOCUMENTS

| 61-55809 | 3/1986 | (JP) . |
| 4-242001 | 8/1992 | (JP) . |
| 5-40402 | 2/1993 | (JP) . |
| 6-97573 | 11/1994 | (JP) . |
| 7-016784 | 1/1995 | (JP) . |
| 7-065028 | 3/1995 | (JP) . |
| 7-073730 | 3/1995 | (JP) . |
| 7-73740 | 3/1995 | (JP) . |
| 7-118618 | 5/1995 | (JP) . |
| 7-173448 | 7/1995 | (JP) . |
| 7-197001 | 8/1995 | (JP) . |
| 7-093053 | 10/1995 | (JP) . |

* cited by examiner

*Primary Examiner*—Cathy Lam
(74) *Attorney, Agent, or Firm*—Pennie & Edmonds LLP

(57) ABSTRACT

An anisotropic conductive composition, which comprises one part by weight of copper alloy powders having an oxygen content of 10 to 10,000 ppm and 0.5 to 250 parts by weight of an organic binder, wherein a copper compound exists on the surfaces of particles of the copper alloy powders.

13 Claims, No Drawings

ANISOTROPIC CONDUCTIVE COMPOSITION

TECHNICAL FIELD

The present invention relates to an anisotropic conductive composition.

The present anisotropic conductive composition can be used in panels of liquid crystal displays, plasma displays, electroluminescence (EL) displays, etc. and also portable telephones, receiver-transmitters, PCMCIA, packaging of photodiodes, etc., and also packaging of LSI (large scale integrated circuit) onto MCM, glass substrates, silicon substrates, printed substrates, etc.

BACKGROUND ART

Anisotropic conductive films have been so far used mainly in electrical connection of liquid crystal-driving IC (electrical connection will be hereinafter referred to merely "connection").

Many anisotropic conductive films have been disclosed so far. For example, JP-A-7-197001 and JP-A-4-242001 disclose anisotropic conductive films using conductive particles composed of metal-plated resin spheres. Furthermore, JP-A-61-55809, JP-A-5-40402, JP-A-7-73740 and JP-A-7-65028, for example, disclose anisotropic conductive films using metal powders such as nickel powders, solder powders, gold-plated nickel powders, etc.

Anisotropic conductive films are films comprising conductive particles dispersed in an organic binder. The anisotropic conductive film is stuck in advance to electrodes or terminals on a substrate to be connected, and then a corresponding further connection substrate or LSI to be connected is placed thereon, followed by pressing with heating, thereby drying or curing the organic binder. The conductive particles existing between the electrodes are deformed, whereby the resulting film has a high conductivity only in the thickness direction between the electrodes, while being insulative between the adjacent electrodes themselves. Thus, the anisotropic conductive films have been used in TAB (tape automated bonding) connection of IC for driving the panels of liquid crystal, plasma display, EL element, etc., bare chip connection of LSI, panel connection of flexible substrate, etc.

Conductive particles for use in the anisotropic conductive film include, for example, metal powders, metal-plated resin powders, etc. Metal powders include, for example, solder powders, nickel powders, gold-plated nickel powders, copper powders, silver powders, etc. Nickel powders have a high resistivity, a low circumferential resistance, and also the problem of increased connection resistance during use. Furthermore, nickel powders have a high hardness and require a rather high pressing force at the connection, thereby increasing substrate damage. For example, nickel powders, when used for connection of glass substrate, have such a problem as substrate breaking.

Solder powders cannot be used because of the high resistivity among the metal powders, and also have such a problem as frequent occurrence of half-molten state of solder, when heated for connection, because of the low melting point.

Gold-plated powders have such a problem as peeling of gold plating, when pressed, and also require a higher pressing force because of use of nickel. Thus, use of soft electrodes, for example, of copper often causes deformation of not only nickel powders but also electrodes.

Copper powders have such problems as poor reliability, because of easy occurrence of deterioration due to oxidation and of a restricted amount of conductive particles interposed between the electrodes.

Silver powders have such problems as easy deterioration of insulation resistance between the adjacent electrodes at a high humidity due to their migration and failure to apply to fine pitch connection.

Metal-plated resin articles, on the other hand, have a low conductivity per se and must be added in a large amount. In case of the metal-plated resin particles, the resin particles per se are easily cracked when the conductive particles are deformed by pressing, causing peeling of platings to lead to connection failure. Particularly in case of the heat cycle, voids are liable to form at the boundaries between the resin particles and the metal layers plated thereon due to a difference in thermal expansion coefficient therebetween, thereby causing the metal platings to peel away from the resin particles. JP-A-7-118618 discloses that, when conductive particles prepared by further providing a insulating coat of organic polymer on the surfaces of metal plated resin particles are used at the connection by pressing or with heating, the insulating coat on the surfaces of conductive particles existing between the electrodes will be broken to ensure interelectrode continuity, whereas the conductive particles failing to contribute to the connection still hold the insulating coat thereon to ensure an insulativeness between the adjacent electrodes. In that case, the insulating coat only on the conductive particles contributing to the connection is not always broken, but the insulating coat on the conductive particles failing to contribute to the connection is also damaged by heat transfer or by flow phenomena at the heating, thereby bringing about such a problem as a failure to maintain the insulativeness fully.

To enhance the productivity, it is required to conduct the pressing for such a short time as a few seconds at the film preparation. The anisotropic conductive composition containing the above-mentioned powders or particles had a poor heat conductivity, and thus heat setting of the composition by pressing for such a few seconds was not satisfactory and considerable connection failures took place. In fine pitch connection, dispersion of conductive particles throughout the fine pitch was also not satisfactory and a problem of connection failures was often encountered.

To produce an anisotropic conductive composition or film, it is necessary to attain satisfactory dispersion of conductive particles. Even in case of occurrence of slight coagulation of conductive particles or segregation of organic binder, etc. in the film, the amount of conductive particles interposed between the electrodes to contribute to the connection is reduced, thereby making them more liable to cause connection failures. Thus, the dispersibility of conductive particles is an important factor in the preparation of an anisotropic conductive composition or film. In the case of well known conductive particles such as metal-plated resin powders, etc., the plating layer will be often peeled away due to mechanical factors when stirred to obtain a high dispersibility.

In the case of nickel powders, a nickel oxide layer is formed on the powder surfaces and thus the dispersibility in an organic binder will be relatively high. However, the nickel oxide on the surfaces is an insulator and is also too hard to break simply by deformation, with the result that the nickel oxide layer remains still between the electrodes and nickel powders, failing to satisfy the connection conductivity.

In case of metal-plated powders such as, for example, gold-plated nickel powders, the gold plating layer will be peeled away when stirred to obtain a high dispersibility, bringing about such a problem as a failure to obtain satisfactory conductive characteristics.

Silver-copper alloy powders already disclosed by the present inventors can indeed give per se a satisfactory conductivity, but have such a problem as fluctuations in conductivity between the electrode terminals due to a poor dispersibility when used in the fine pitch connection.

In the connection of an anisotropic conductive film by pressing together with heating, it is necessary to cure the organic binder in the anisotropic conductive film at the same time, but such a short time as about 10 to about 20 seconds is required for the heating. To cure the organic binder containing conductive particles as dispersed therein for such a short time, the conductive particles must have an enhanced heat conductivity, but well known conductive particles have too low a heat conductivity to obtain a satisfactory curing.

As to the particle size distribution of conductive particles, JP-B-6-97573 discloses use of conductive particles having a ratio of minimum size to maximum size of 0.5–1 for the particle size distribution. However, the fine pitch connection mostly requires a film thickness of about 10 microns for the anisotropic conductive film, where the conductive particles having only the sharp particle size distribution hardly can give a uniform film, because a paste comprising the conductive particles, the organic binder and, if required, a solvent has no adequate thixotropy for the coating step in the film formation.

Thermoplastic resins and thermosetting resin have been so far used as an organic binder. In the case of using epoxy resin as a thermosetting resin, it is known to use a latent curing agent. Needless to say, the stability of dispersed curing agent is important for obtaining a preservation stability of anisotropic conductive films. Since the conventional conductive particles had no satisfactory dispersibility, an excessively strict strength and time were required for mechanical dispersion treatment of conductive particles for use in fine pitch connection. Thus, there were such problems as breaking of the protective film of microcapsule-type curing agent and consequent instability of the curing agent per se. For formation of anisotropic conductive films, it is necessary to use conductive particles having exceptional dispersibility and which causes no damage to the protective film of the curing agent during the coating process. For example, nickel powders in an indeterminate form, etc. have a poor dispersibility and a high hardness and thus have such problems as the necessity for application of pressure at the pressing and also breaking of the protective film of dispersed microcapsule-type curing agent during the process of forming anisotropic conductive films. Thus, the preservation stability of anisotropic conductive films is highly deteriorated and fluctuations in the connection conductivity are liable to occur.

DISCLOSURE OF THE INVENTION

The present invention relates to an anisotropic conductive composition, which comprises one part by weight of copper alloy powders having an oxygen content of 10 to 10,000 ppm and 0.5 to 250 parts by weight of an organic binder, where a copper compound exists on the surfaces of particles of the copper alloy powders.

BEST MODE FOR CARRYING OUT THE INVENTION

The present anisotropic conductive composition includes a paste form and a film form. The paste form refers to a liquid form, and may contain, if required, a solvent, etc. The film form refers to an apparent film form made by application to a substrate such as a base film, etc., followed by drying.

Copper alloy powders include, for example, powders of Cu alloys with at least one member selected from the group consisting of Ag, Ni, Sn, Pb, Pt, Pd, Au, Si, Zn, P, Ti, C, Co and Fe. Particularly, copper alloy powders composed mainly of Cu—Ag or Cu—Au are preferable. More preferably, the composition of the copper alloy powders can be represented by the general formula $M_xCu_{1-x}$ (where M is at least one member selected from the group consisting of Ag and Au and x is the atomic ratio $0.001 \leq x \leq 0.6$). The copper alloy powders can include solid solutions of copper and also inter-metallic compounds of copper.

Copper alloy powders preferably have a resistivity of $1.5 \times 10^{-6}$ to $8 \times 10^{-5}$ $\Omega \cdot cm$.

The present composition can lower the connection resistance fully when used in the electrical connection by virtue of the use of copper alloy powders.

Furthermore, the copper alloy powders for use in the present invention have a copper compound on the surfaces of copper alloy particles and thus have a good wettability with the organic binder. The resulting anisotropic conductive composition can fully satisfy the fine pitch connection. That is, the high wettability of the copper compound on the surfaces of copper alloy powders with the binder makes coagulation of alloy powders take place less, thereby allowing the alloy powders to fully disperse throughout the organic binder. Thus, conductive particles interposed between the electrodes at the fine pitch can be less fluctuated in distribution, and the dielectric breakdown by coagulated metal powders between the adjacent electrodes can be prevented.

The copper compound is relatively soft, and thus the copper compound on the surfaces of copper alloy powders can be easily broken by the electrodes at the same time when the copper alloy powders are deformed by pressing whereby connection between the metal surfaces, per se can be obtained. At that time, short circuits due to contact of copper alloy powders per se in the direction from one adjacent electrode to another adjacent electrode can be prevented by the high dispersibility of the particles, thereby maintaining the insulativeness between the adjacent electrodes. Furthermore, even if there is any contact between the copper alloy powders failing to contribute to the connection, the insulation can be obtained because the copper compound is present on the powder surfaces. This is another advantage of the present invention. The copper alloy powders are preferably powders of copper-silver alloy or copper-gold alloy. The copper compound existing on the powder surfaces contributes to the powder dispersibility and insulation between the adjacent particles, and, when the powder particles are deformed by pressing, the copper compound on the powder surfaces are broken to expose the metal surface of copper or highly conductive silver, thereby making these metal surfaces act to maintain the conductivity.

When the copper alloy is a copper-silver alloy or a copper-gold alloy, it is preferable that concentration of silver or gold on the surfaces of copper alloy powders is higher than the average concentration throughout the alloy, because of such an advantage that exceptional conductivity can be obtained without impairing the dispersibility at fine pitches or insulation between the adjacent particles.

Oxygen-containing compounds adsorbed on the surfaces of copper alloy powders such as water, oxygen, carbon dioxide, etc. are released from the surfaces by dissolution into the organic binder, solvent, etc., when the powders are dispersed, and thus fail to contribute to an increase in wettability of the metal powders with the organic binder. That is, the presence of copper compound on the surfaces of metal powders can attain the dispersibility as desired in the present invention.

Copper hydroxide, copper oxide, copper hydroxide oxide, etc., are preferable as the copper compound existing on the surfaces of copper alloy powders.

In that case, if the oxygen content of copper alloy powders is less than 10 ppm, no satisfactory particle dispersion effect can be obtained, whereas above 10,000 ppm the copper compound cannot be easily broken and remains between the copper alloy powders and the connection electrodes, thereby deteriorating the connection resistance. Thus, the oxygen content of copper alloy powders is preferably 10 to 10,000 ppm, more preferably 30 to 5,000 ppm.

Measurement of oxygen content can be made by an oxygen/nitrogen analyzer (EMGA 650: made by Horiba Seisakusho K.K.) by elevating the temperature upto 2,000° C.

Though the copper alloy powders are preferably of Cu—Ag alloy or Cu—Au alloy, as mentioned above, these alloys can contain other components such as Pt, Pd, etc. Cu—Ag based copper alloy powders are particularly preferable, and copper alloy powders represented by the general formula. $Ag_xCu_{1-x}$ (where x is an atomic ratio in $0.001 \leq x \leq 0.6$) are most preferable.

When x is less than 0.001, the oxidation resistance is not satisfactory after the connection and the resistance is liable to increase. When x exceeds 0.6, the insulation between the adjacent electrodes at the fine pitch connection is liable to break due to silver migration caused by the high humidity. Preferable is $0.01 \leq x \leq 0.5$, more preferable is $0.01 \leq x \leq 0.4$. It is preferable that the silver concentration on the surfaces of copper alloy powders having the above-mentioned composition is higher than the average silver concentration throughout the copper alloy powders. That is, a higher surface silver concentration than the average silver concentration can give a distinguished circumferential resistance at the pressing connection without impairing the dispersibility. Furthermore, an increase in silver concentration on the particle surfaces can make the surfaces softer and also can make the surfaces easily deformable upon pressing at the connection. Thus, sufficient contact areas between the particles and also better electrical connection can be also attained.

It is preferable that the silver concentration on the particle surfaces is at least 1.5 times as high as the average silver concentration throughout the copper alloy powders. Silver concentration on the particle surfaces means a ratio of $(Ag+Au)/(Ag+Au+Cu)$, calculated from the respective total area values of peaks of $Cu_{2p}$, $Ag_{3d}$ and $Au_{4f}$, determined by an X-ray photoelectron spectroscopic analyzer (XPS), corrected by an instrument correction factor. Average silver concentration or gold concentration throughout the copper alloy was determined by completely dissolving the copper alloy powders in concentrated nitric acid or aqua regia, followed by measurement with a high frequency, inductively coupled plasma spectrometer (ICP).

Average particle size of copper alloy powders for use in the present invention is 2 to 15 microns. When the average particle size is less than 2 microns, the conductivity will be poor because the average particle size is equal to the same roughness level of the electrode surfaces and also the circumferential resistance will be deteriorated because the surface activity of the fine powders is increased. When the average particle size exceeds 15 microns, short circuits will occur between the adjacent electrodes in the fine pitch connection or the continuity will be unstable, because the quantity of conductive particles interposed between the electrodes is extremely small. Preferable average particle size is 2 to 10 microns.

Copper alloy powders, at least 30% by volume of which is in a particle size range of average particle size±2 microns, are preferably used in the present invention, because a large amount of conductive powders effectively contributing to the effective interelectrode continuity can be made present thereby. Use of copper alloy powders having such a particle size distribution has such advantages that an appropriate thixotropy can be given to the resulting anisotropic conductive composition and a sufficiently uniform thin film can be readily obtained upon coating. Furthermore, it is preferable that the copper alloy powders have such a particle size distribution and contain a very small amount of fine powders. In that case, a very small amount of fine powders can attach to larger particles without any coagulation of fine powders themselves, and when aluminum electrodes have an oxide film, such an additional advantage can be thus obtained that the fine powders can break the film to improve the connection reliability. Particularly for coating a thin film, the ratio of minimum particle size to maximum particle size is preferably 0.001 to less than 0.5, more preferably 0.001 to 0.45, and most preferably 0.001 to 0.3.

Coatability of a thin film can reduce the organic binder flow into the area between the adjacent electrodes at the fine pitch connection, thereby ensuring good interelectrode connection and insulativeness. Since the copper alloy powders for use in the present invention have a good conductivity, such an advantage as a good connection resistance can be obtained, even if the thin film contains a small amount of particles.

In the present invention, average particle size was determined as the volume cumulative average particle size, using a laser diffraction type meter, model RODOS SR (SYMPATEC HEROS & RODOS). The amount of copper alloy powders having particle sizes in a range of average particle size±2 microns was determined by a volume cumulative particle size distribution meter. Maximum particle size means a particle size corresponding to 98% cumulative value in the volume cumulative particle distribution, whereas minimum particle size means a particle size corresponding to 5% cumulative value in the volume cumulative particle size distribution.

As described above, the copper alloy powders have a copper compound on the particle surfaces, and preferably the copper compound induces copper oxide, copper hydroxide and copper hydroxide oxide. Particularly preferably, the copper compound contains monovalent copper, because it can improve the wettability with the organic binder and is more readily broken upon pressing than a divalent copper compound, thereby exposing the metal surfaces. However, when the ratio of divalent copper is too high, the copper compound is exposed to the electrode boundary surfaces at the connection to deteriorate the conductivity. Presence of zero-valent copper and divalent copper was identified from the shift of peak corresponding to the $Cu_{2p}$ binding energy by XPS, whereas presence of monovalent copper was checked by Auger spectra. A larger ratio of (zero-valent copper+monovalent copper) to divalent copper in the copper compound is preferable. A ratio of (zero-valent copper+monovalent copper)/divalent copper is at least 1, preferably at least 5, more preferably at least 10. The ratio of (zero-valent copper+monovalent copper)/divalent copper was calculated from an area value of $Cu_{2p}$ peak by XPS.

Preferably, the copper alloy powders for use in the present invention are metal powders prepared by a plating process, a coprecipitation process, a mechanical alloying process, an atomizing process, etc. Metal powders prepared by an atomizing process are particularly preferable and metal powders prepared by an atomizing process using an inert gas are most preferable.

It is preferable to control the oxygen content of the copper alloy powders to be prepared by an atomizing process using an inert gas by means of the oxygen content of molten copper alloy during the preparation of the alloy powders.

For example, according to a preferred embodiment of the present composition, metal powders having a definite composition of silver or gold and copper are charged into a graphite crucible and heated in an inert gas up to 1,700° C., where the heating is carried out up to 900° C. under reduced pressure at first, and then up to 1,700° C. under atmospheric pressure while supplying the inert gas. After being kept constant at 1,700° C. for about 5 minutes, the molten alloy is atomized with helium, argon, nitrogen, hydrogen or their mixed gases, each having an oxygen content of not more than 0.2%. It is necessary to reduce the oxygen content of the molten alloy to not more than 500 ppm. Oxygen content of the molten alloy as measured is an oxygen concentration determined by cooling the molten alloy to room temperature in the inert atmosphere without atomizing the molten alloy and analyzing the resulting solidification product by EMGA. When fine powders are taken out before being thoroughly cooled, the fine powder surfaces are oxidized in some cases by friction, etc., since the fine powders accumulated in the silo are still hot. Thus, it is necessary to leave the fine powders standing in the inert gas atmosphere for about 5 hours to about 24 hours.

It is preferable not to bring the resulting copper alloy powders into contact with the moisture in the air as much as possible. For example, if adsorbed water remains in the powders, the adsorbed water will promote to cure the organic binder such as epoxy resin, etc., thereby deteriorating the preservation stability of the composition or advancing the oxidation excessively.

The present anisotropic conductive composition contains, besides the copper alloy powders, 0.5 to 250 parts by weight of an organic binder per one part of the copper alloy powders.

The organic binder includes at least one member selected from the group consisting of thermosetting resins, thermoplastic resins, photosetting resins and electron beam-setting resins. These resins include, for example, epoxy resin, phenol resin, silicone resin, urethane resin, acrylic resin, polyimide resin, phenoxy resin, polyvinylbutyral resin, SBR (styrene butadiene rubber), SBS (styrene butadiene styrene block-copolymer), NBR (nitrile butadiene rubber), polyethersulfone resin, polyether terephthalate resin, polyphenylene sulfide resin, polyamide resin, polyether oxide resin, polyacetal resin, polystytrene resin, polyethylene resin, polyisobutylene resin, alkylphenol resin, styrene-butadiene resin, carboxyl-modified nitrile resin, polyphenylene ether resin, polycarbonate resin, polyether ketone resin, etc. or their modified resins.

Particularly when the adhesiveness to the substrate is required, it is preferable that the organic binder contains epoxy resin. When the organic binder contains epoxy resin, the wettability with the copper alloy powders can be improved and particularly dispersibility in the fine pitches can be improved. In case of using epoxy resin, it is preferable to mix it with phenoxy resin, polyester resin, acrylic rubber, SBR, NBR, silicone resin, polyvinylbutyral resin, urethane resin, polyacetal resin, melamine resin, polyamide resin, polyimide resin, SBS, or rubbers or elastomers having functional groups such as cyanoacrylate, carboxy groups, hydroxyl groups, vinyl groups, amino groups, etc. to give an ability to repair.

The amount of other organic binder for the mixing other than the epoxy resin is preferably 1 to 250 parts by weight per 100 parts by weight of the epoxy resin.

For the epoxy resin, it is preferable to use epoxy resins of bisphenol A type, bispheno F type, bisphenol S type, phenol-novolak type, cresol-novolak type, alkyl polyhydric phenol type, phenylglycidyl ether type, polyfunctional polyether type, bromophenol-novolak type, modified bisphenol S type, diglycidylaniline type, diglycidyl-o-toluidine type, and urethane-modified, rubber-modified, silicone-modified, linearly modified type, etc.

When the amount of the organic binder is less than 0.5 parts by weight per one part by weight of the copper alloy powders in the present anisotropic conductive composition, the coatability will be poor and the short circuits are liable to occur between the adjacent electrodes. When the amount of the organic binder exceeds 250 parts by weight, the amount of the copper alloy powders will be too small to obtain satisfactory continuity. The amount of the organic binder is preferably 0.5 to 180 parts by weight, more preferably 0.5 to 40 parts by weight.

When epoxy resin is used as an organic binder, it is preferable to use a latent curing agent. Preferable latent curing agents include, for example, boron compounds, hydrazides, tertiary amines, imidazoles, dicyandiamides, inorganic acids, carboxylic acid anhydrides, thiols, isocyanates, boron complex salts and their derivatives.

Among the latent curing agents, a microcapsule-type curing agent is preferable. The microcapsule-type curing agent is the above-mentioned curing agent whose surface is coated with thermoplastic resin, etc., and the microcapsule is broken at the temperature or under the pressure for the connection working to allow the curing agent to rapidly disperse into the binder and promote curing. Among the microcapsule-type latent curing agents, microcapsule-type, imidazole derivative-based epoxy compounds are more preferable.

The microcapsule-type, imidazole derivative-based epoxy compound is a curing agent having an enhanced stability at the ordinary temperature, prepared by pulverizing a reaction product of an imidazole derivative and an epoxy compound into fine powders, followed by further reaction with an isocyanate compound to effect encapsulation, and can melt at a temperature of 60° to 80° C. and considerably promote to cure the epoxy compound approximately at the pressing temperature. The imidazole derivative includes, for example, imidazole, 2-methylimidazole, 2-ethylimidazole, 2-ethyl-4-methylimidazole, 2-phenylimidazole, 2-phenyl-4-methylimidazole, 1-benzyl-2-methylimidazole, 1-benzyl-2-ethylimidazole, 1-benzyl-2-ethyl-5-methylimidazole, 2-phenyl-4-methyl-5-hydroxymethylimidazole, 2-phenyl-4,5-dihydroxymethylimidazole, etc.

Epoxy compounds for use together with those curing agents include, for example, glycidyl ether-type epoxy resins such as bisphenol A, bisphenol F, phenol-novolak, bromobisphenol A, etc., diglycidyl esters of dimeric acids, diglycidyl esters of phthalic acid, etc. In case of using these epoxy resins, the amount of microcapsule-type curing agent can be 5 to 250 parts by weight per 100 parts by weight of epoxy resin. When the amount of microcapsule-type curing agent is less than 5 parts by weight, curing will not be satisfactory, whereas above 250 parts by weight preservation stability will not be satisfactory. In case of bare chip connection, etc., there is a keen demand for shortening the time of one-chip connection. The relationship between the curing rate and the organic binder-removing rate is important for effecting the curing for a shorter time, and to this effect it is necessary to use an appropriate amount of the curing agent. The amount of the curing agent is preferably 20 to 200 parts by weight, more preferably 42 to 180 parts by weight, most preferably 43 to 160 parts by weight per 100 parts by weight of the epoxy resin.

Particle sizes of the microcapsule-type curing agent are preferably 1 to 10 microns in terms of average particle size.

When the average particle size exceeds 10 microns, the resulting anisotropic conductive film will have an uneven film thickness, thereby causing connection failure. When the average particle size is less than 1 micron, on the other hand, the surface area of microcapsule-type curing agent will be too large, thereby deteriorating the preservation stability. When the particle sizes of microcapsule-type curing agent are on the same order as those of the copper alloy powders for use in the present invention, the copper alloy powders start to undergo deformation by application of a pressure, breaking microcapsules at the same time. Thus, the organic binder can be cured by pressing. When the microcapsule-type curing agent is too large in size, microcapsules are broken at first, thereby curing the organic binder too hard before the pressing, and thus it is hard for the copper alloy powders to undergo deformation. When the microcapsule-type curing agent is too small in size relative to the copper alloy powders, on the other hand, the copper alloy powders will be deformed at first, and microcapsules will be broken from the end of pressing on to promote to cure the organic binder. Thus, the curing will not be satisfactory.

Since the present copper alloy powders have a good heat conductivity, heat can be readily transferred to the organic binder and the curing agent near the metal powders at the same time when the microcapsule-type curing agent is broken by pressing, and thus the curing can be promoted and stable connection of the metal powders can be obtained. A particular effect can be obtained under such strict heat transfer conditions as connection working for a shorter time to meet the recent demand for a high productivity.

In case of coating of the present anisotropic conductive composition, an appropriate solvent can be used, if necessary. Such a solvent as not to damage the microcapsule-type curing agent, that is, not to dissolve the capsule protective film is desirable, and preferably includes, for example, methylethylketone, toluene, benzene, xylene, methylisobutylketone, ethyl acetate, butyl acetate, aromatic hydrocarbons, ethers, ketones, esters, etc.

To improve the dispersibility of conductive particles and humidity resistance after the connection, the present anisotropic conductive composition can contain a silane coupling agent, a titanium coupling agent, an aluminum coupling agent, etc. Particularly preferable are the silane coupling agent and the titanium coupling agent.

The silane coupling agent includes organic silicon monomers having at least two different reactive groups in the molecule, where one of the reactive groups is a reactive group capable of undergoing chemical combination with inorganic materials such as glass, metal, silicon, etc. (e.g. methoxy group, ethoxy group, silanol group, halogen group, alkoxide group, acyloxy group, etc.) and the other is a reactive group capable of undergoing chemical combination with organic materials constituting synthetic resins (e.g. vinyl group, epoxy group, methacryl group, amino group, mercapto group, diamino group, aliphatic epoxy group, etc.).

Preferable examples of the silane coupling agent include vinyltrichlorosilane, vinyltriethoxysilane, γ-chloropropyltrimethoxysilane, γ-chloropropylmethyldichlorosilane, γ-chloropropyldimethoxysilane, γ-chloropropylmethyldiethoxysilane, γ-aminopropyltriethoxysilane, N-(β-aminoethyl)-γ-aminopropyltrimethoxysilane, N-(β-aminoethyl)-γ-aminopropylmethyldimethoxysilane, γ-mercaptopropyltrimethoxysilane, γ-glycidoxypropyltrimethoxysilane, γ-glycidoxypropylmethyldimethoxysilane, γ-methacryloxypropyltrimethoxysilane, γ-methacryloxypropylmethyldimethoxysilane, alkoxysilane, chlorosilane, etc.

The titanium coupling agent includes, for example, organic titanium compounds such as $R_1$—Ti—$(R_2)_3$ (where $R_1$ is an alkoxy group having 1 to 4 carbon atoms, preferably 1 to 3 carbon atoms and $R_2$ is a carboxylic acid ester having 2 to 20 carbon atoms, preferably 2 to 18 carbon atoms).

Preferable examples of the titanium coupling agent include isopropyltriisostearyl titanate, isopropyltrioctanoyl titanate, isopropyl-tris(dioctyl pyrophosphate)titanate, isopropyl (N-aminoethylaminoethyl)titanate, tetraoctyl-bis(ditridecylphosphate)titanate, tetra(2,2-diallyloxymethyl-1-butyl)bis(ditridecyl(phosphate titanate, bis(dioctyl pyrophosphate)oxyacetate titanate, bis(dioctyl pyrophosphate)ethylene titanate, isopropyldimethacrylisostearoyl titanate, isopropylisostearoyldiacryl titanate, isopropyltri(dioctyl phosphate)titanate, isopropyltricumylphenyltitanate, tetraisopropyl-bis(dioctyl phosphate)titanate, etc.

That is, the above-mentioned coupling agents are disposed on the surfaces of copper alloy powders by coordination and extend the hydrophobic organic chain such as a higher fatty acid group towards the organic binder, thereby effectively preventing water absorption of copper alloy powders. Up to 2 parts by weight of the coupling agent can be added to 100 parts by weight of the conductive particles. Furthermore, the copper alloy powders can be treated with the coupling agent in advance. In the case of treatment with the coupling agent in advance, copper alloy powders are immersed in a solution of a coupling agent in an appropriate solvent, left standing therein for a few hours to a few days and then dried in air or in an inert gas atmosphere at a temperature from room temperature to 50° C. The amount of the coupling agent adsorbed on the surfaces of copper alloy powders is determined by dissolving the copper alloy powders into a concentrated nitric acid, followed by measurement with a high frequency, inductively coupled plasma spectrometer (ICP). The amount of silicon of the silane coupling agent or titanium of the titanium coupling agent adsorbed on the surfaces of copper alloy powders is preferably about 0.1 to about 500 ppm. Above 500 ppm, the coupling agent existing between the electrodes will deteriorate the continuity at the connection. The amount is more preferably 0.1 to 200 ppm.

The anisotropic conductive composition can be prepared in the following manner. First of all, copper alloy powders, an organic binder and, if necessary, a solvent and/or a coupling agent are mixed together. Mixing can be carried out by a well known mixer such as a planetary extruder, a triple roll, a kneader, a squeeze roller, a vaned stirrer, a ball mill, etc. and must be continued until the copper alloy powders have been thoroughly dispersed.

Furthermore, the predetermined amount of a curing agent is mixed therewith, if necessary. In case of using a microcapsule-type curing agent, the predetermined amount thereof can be mixed therewith later.

The thus obtained anisotropic conductive composition has a viscosity in a range of about 1,000 cps to about 200,000 cps, which is preferably prepared depending upon its use.

The resulting anisotropic conductive composition can be applied per se to electrodes or terminals on a connection substrate by such a means as a dispenser, screen printing, etc.

To prepare an anisotropic conductive film, the anisotropic conductive composition can be applied to a base film such as an insulating film, etc. by a well known coating means such as a blade, a die coater, etc. When the resulting coating film contains a solvent, it is preferable to fully dry the film. Drying temperature is preferably from room temperature to about 80° C.

Thickness of the anisotropic conductive film is about 5 to about 500 microns without any specific limitation to the width. The anisotropic conductive film can be used for the connection after slitting. For example, it is preferable to use an anisotropic conductive film having a width of about 0.2 to about 200 mm after winding around a reel. Such a long film can be wound around the reel to a film length of a few meters to about 1,000 m. A reel with a guide is preferable.

It is preferable that the present anisotropic conductive film has an insulating film (which will be hereinafter referred to as "base film") preferably on at least one side of the film from the viewpoint of improvement in preservation stability and workability at the connection. The base film can serve as an underlayer for application of the anisotropic conductive composition, and is preferably a film having such a mechanical strength as to withstand winding around the reel, etc.

Materials for the base film include, for example, polyethylene terephthalate (PET), Teflon, polyimide, polyester, polyethylene, polypropylene, polyamide, and inorganic films of alumina, alumina nitride, etc. Since the anisotropic conductive film is sticky, it is preferable to subject the base film to further treatment with titanium oxide, silicone resin, alkyd resin, etc. The thickness of the base film is preferably about 1 to about 300 microns.

The film obtained by applying the present anisotropic conductive composition to a base film can be laminated, if necessary, with a cover film for enclosing the layer of the anisotropic conductive composition from the opposite side to the base film.

Materials of cover film include, for example, PET, Teflon, polyimide, polyester, polyethylene, polypropylene, polyamide or the above-mentioned inorganic film or those further treated with silicone resin, alkyd resin or titanium oxide, as in the case of materials for the base film, but are selected preferably so as to make the stickiness less than that of the base film. When an anisotropic conductive film having a base film and a cover film is used for the connection, it is preferable to peel away the cover film therefrom at first and stick the anisotropic conductive film to a connection substrate or a chip, and then connect it to another substrate or chip after peeling away the base film therefrom.

A method for using the present anisotropic conductive composition or anisotropic conductive film will be described below, referring to embodiments.

When the present anisotropic conductive composition is used directly, it is applied by means of a dispenser or a screen printing, etc. In that case, when the solvent evaporates during the curing, voids are generated. Thus, it is preferable that the anisotropic conductive composition contains no solvent. For example, the anisotropic conductive composition is applied to electrodes and a further connection substrate or LSI chip to be connected is laminated thereon so as to enclose the composition. Then, heat and pressure are applied thereto from above using a means to cure the organic binder, whereby only the copper alloy powders existing between the electrodes undergo deformation and continuity is obtained only in the interelectrode direction (film thickness direction). Insulativeness is thereby maintained between the adjacent electrodes.

In the case of using the present anisotropic conductive film having a cover film, at first the cover film is peeled away therefrom and the anisotropic conductive film is then stuck to electrodes on a connection substrate by use of the stickiness of the anisotropic conductive composition. Pressure and heat are applied thereto appropriately to such a degree as not to peel the film away, thereby obtaining tentative pressing adhesion. Then, the base film is peeled away therefrom to leave only the anisotropic conductive composition as stuck to the connection substrate. Then, electrodes on a further connection substrate or LSI chip to be connected are placed thereon so as to be aligned with the electrodes on the first connection substrate and pressed by a tool so as to interpose the anisotropic conductive composition therebetween. Then, pressure and heat are applied thereto to cure the organic binder, and continuity can be obtained between the electrodes in alignment to one another by deformation of the copper alloy powders.

Conductive particles of the present anisotropic conductive composition or film can undergo relatively easy deformation even under a low pressure at the connection, thereby obtaining a high interelectrode conductivity. The present anisotropic conductive composition or film has such an advantage as being connectable under a pressure from 2 $kgf/cm^2$ to several hundred $kgf/cm^2$, preferably from 5 $kgf/cm^2$ to 700 $kgf/cm^2$.

As to the pressing temperature at the connection, conventional materials undergo connection at such a high temperature as 170° to 230° C., whereas the present anisotropic conductive composition or film can be used not only at the known high pressing temperature, but also in a range of lower temperatures such as 100° C. to 160° C. due to the exceptional deformability and heat conductivity as mentioned before, and also has such a further advantage as considerable improvement of misalignment at the fine pitches.

Heating time for conventional materials requires 15 to 20 seconds, whereas the present anisotropic conductive composition and film can attain satisfactory connection even for such a short time as about 5 seconds with a further advantage such as an exceptional productivity. This is because of a high heat conductivity of copper alloy powders for use in the present invention, and the consequent improvement in heat transfer to the organic binder and stable, uniform curing of the organic binder.

Good electrical contact can be obtained between a connection substrate and a further connection substrate or chip to be connected by using the present anisotropic conductive composition or film.

The connection substrate for use in the present invention includes, for example, electrically wired substrate, etc. i.e. panels such as a liquid crystal display panel, a plasma display panel, an electroluminescence display panel, etc.; printed substrates; built-up substrates (multi-layered substrates made from photosensitive resin, each comprising insulating layers and conductor circuit layers alternately laminated one upon another, etc.); low temperature-fired substrates; etc. Further connection substrate or chip to be connected include, for example, flexible or rigid printed substrates, condensers, resistors, LSI chips, flexible substrates to which coils or LSI chips have been already connected TCP (tape carrier packages), LSI packages such as QFP (quad flat package), DIP (dual in-line package), SOP (single out-line package), etc., and the like.

Materials for the connection substrate and the further connection substrate to be connected are not particularly limited, and include, for example, polyimide, glass epoxy, paper phenol, polyester, glass, silicone, polyether imide, polyether ketone, polyethylene terephthalate, polyphenylene ether, thermosetting polyphenylene ether, polyphenylene sulfide, glass polyimide, alumina, alumina nitride, tetrafluoroethylene, polyphenylene terephthalate, BT resin, polyamide, polyethersulfone, photosensitive epoxy acrylate and their derivatives, etc. Monolayer and multilayered substrates, substrates for low temperature firing, etc. made from these materials can be used.

Conductors to the electrodes for connection, formed on the connection substrate or further connection substrate to be connected are not particularly limited, and include, for example, well known conductors such as ITO (indium-tin oxide), IO (indium oxide), copper, silver, copper-silver alloy, silver-palladium, gold, platinum, nickel, aluminum, silver-platinum, tin-lead solder, tin-silver solder, tin, chromium or these conductors plated with gold, tin, nickel, tin-lead, chromium, or the like. The conductors can be formed by a well known method, for example, by plating, vapor deposition, reflow, conductor paste, wire bonding, or photolithography.

The present anisotropic conductive composition or film is repairable. In case of repairing, a deteriorated connection substrate (e.g. TAB, etc.) or chip is mechanically peeled away, and a portion of the anisotropic conductive composition or film remaining on the substrate is repeatedly removed with a solvent. Removal is repeatedly carried out until the anisotropic conductive composition or film on the connection terminals has been removed to some extent. A fresh anisotropic conductive composition or film is printed or stuck to cleaned connection terminals and a fresh connection substrate or chip is placed thereon for reconnection. Since the present anisotropic conductive composition or film contains copper alloy powders having a specific particle size distribution, electrode remnants such as copper remaining on the further connection electrode to be connected or electrodes per se can be effectively rubbed away and polished clean by a solvent-impregnated cotton swab stick, when the deteriorated member is peeled away for repairing. Cleaned terminal electrodes can be provided for reconnection thereby.

The present invention further provides a substrate for connection with an anisotropic conductive film as stuck to terminals for connection provided on an insulating substrate having a conductor circuit.

That is, the present substrate for connection refers to an uncured anisotropic conductive film as stuck to connection terminals on a substrate by virtue of stickiness in advance. Since the anisotropic conductive film is in a stuck state in advance, no such laborious work as used in the ordinary connection methods, i.e. taking out an anisotropy conductive film from the reel to a predetermined length, followed by tentative adhesion thereof onto the connection terminals on the connection substrate, is required at all, and connection can be attained only by alignment of the substrate for connection to the further connection substrate to be connected, followed by application of heat and pressure, thereby attaining process simplification. Furthermore, no such a work as sticking an anisotropic conductive film to hard-to-stick positions, such as steps on different levels, on the further connection substrate to be connected is required at all, thereby eliminating connection problems due to the tentative adhesion work. Still furthermore, the present anisotropic conductive film is distinguished in the conductivity of copper alloy powders as conductive metal powders, and thus it is not necessary to drastically increase the proportion of particles in the anisotropic conductive film. In other words, exceptional distinctive light transmission can be obtained thereby. That is, even in the stuck state of the film on the connection terminals on the connection substrate the underlying connection terminals can be checked through the film. Thus, the connection substrate with an anisotropic conductive film stuck thereto can be provided on the further connection substrate to be connected with good precision. For example, the process can be simplified by pasting an anisotropic conductive film onto the connection terminals on a connection substrate in advance, thereby eliminating a sticking error problem and a laborious problem of sticking to a substrate having complicated step differences.

For the substrate for connection, any of flexible substrates and rigid substrates can be used. Flexible substrates can take an advantage of light transmission more effectively. Particularly preferable are flexible substrates having a light transmission. Flexible substrates include, for example, polyester substrates, polyimide substrates, polyamide substrates, alumina substrates, alumina nitride substrates, etc., and are not particularly limited. Circuits on the connection substrate can be formed by copper foil etching and printing, sintering, plating, electro-deposition, etc. with a conductor paste (i.e. pastes of copper, silver, gold, silver-palladium, carbon, platinum or the like). Substrate for connection with the present anisotropic conductive film stuck thereto can be provided in such a state as a plurality of substrates for connection being wound around a reel or as individual connection substrates being stuck to by the anisotropic conductive films, respectively.

The substrate for connection with the present anisotropic conductive film stuck thereto may be protected with a cover film on the opposite side of the anisotropic conductive film to the substrate-facing side, where the substrate for connection is placed on the further connection substrate to be connected and is connected thereto by application of heat and pressure after removing the cover film away therefrom by peeling.

The present anisotropic conductive composition or film and substrate for connection with the anisotropic conductive film stuck thereto will be described in detail below, referring to Examples.

EXAMPLES

Table 1 shows examples of preparing conductive powders such as copper alloy powders for use in the present invention.

At first, predetermined amounts of copper and a secondary component were placed into a graphite crucible (when the second component was such noble metals as silver, gold, palladium, etc.) and heat-melted in an inert gas atmosphere (i.e. helium, nitrogen, etc.) by high frequency induction heating. When the metal component contained nickel, a boron nitride crucible was used.

The crucible was heated to 900° C. under reduced pressure, and then sealed with an inert gas having an oxygen content of not more than 0.1%, and the metal component was heat-melted at 1,700° C. and 1 atm, and kept at 1,700° C. for at least about 3 minutes, while circulating the molten metal by convection. It is preferable that the temperature does not exceed 2,000° C. The oxygen content of molten metal is to be reduced to not more than 500 ppm, preferably to not more than 100 ppm, more preferably to not more than 50 ppm. The oxygen content of molten metal was determined by analyzing the solidification product obtained by cooling the molten metal per se to room temperature in the inert gas atmosphere without atomizing, using EMGA.

The molten metal, after the oxygen was fully removed therefrom at the high temperature, was atomized with helium, argon, nitrogen, hydrogen or their mixture with an oxygen content of not more than 0.2%.

It is preferable to fully cool the fine powders solidified by atomizing with the inert gas at room temperature in the inert gas atmosphere. Since the fine powders accumulated in the silo are still hot, surface oxidation takes place in some cases due to friction, etc., when the hot fine powders are taken out of the silo immediately. In that case, an appropriate amount of soft copper compounds are formed only on the surfaces of metal powders while kept at room temperature after the atomizing, because the inert gas steam contains oxygen-containing substances (moisture, oxygen, etc.) generated from the metal powders through release and reduction. In that case, it is necessary to keep the metal powders in the inert gas steam for at least one hour.

It is preferable that the copper alloy powders so obtained are kept away from contact with the moisture in the air as much as possible to prevent excessive oxidation or excessive moisture adsorption. For example, the resulting copper alloy powders must be kept at a temperature of not higher than 25° C. and a humidity of not more than 40%. For example, remaining adsorbed water, if any, promotes curing of the epoxy resin as an organic binder, thereby deteriorating the preservation stability in some cases, or making the oxidation proceed excessively.

The resulting fine powders are classified by a pneumatic classifier preferably in an inert gas atmosphere at a temperature of not higher than 30° C., whereby powders having specific particle sizes were obtained. The metal powders so obtained had a nearly spherical shape. Atomization with an inert gas, etc. containing an excessive content of oxygen is liable to make the shape irregular and cause connection failure at the pressing.

Average composition, metal surface composition, average particle size, particle size distribution, oxygen content, maximum particle size, minimum particle size, Si or Ti content, and copper valency of copper alloy powders were determined by the above-mentioned methods. In Table 1, Si or Ti content was determined by immersing the powders into a solution of isopropyltristearyl titanate in toluene, followed by being left standing for one day and drying in air at 50° C. for 10 minutes, using ICP (inductivity coupled plasma emission spectrochemical analyzer).

Furthermore, organic binders for use with the metal powders of Table 1 are shown in Table 2.

Microcapsule-type curing agents and curing agents for simultaneous use with epoxy resin are shown in Table 3.

Anisotropic conductive compositions and films each comprising metal powders, organic binders, microcapsule-type curing agents and coupling agents shown in Tables 1, 2, 3 and 4, respectively, in mixture are shown in Tables 5 and 6, respectively. The size of anisotropic conductive films was 100 mm wide, 50 m long and 10–40 microns thick, and they were slit into widths of 1 mm, 1.5 mm and 2 mm.

Anisotropic conductive films were applied at 70° C. and dried at the same temperature for 10 minutes.

Preservation stability of anisotropic conductive compositions and films was evaluated by stickiness (tackiness) when left standing at 25° C. Those with a stickiness whose initial value was reduced to less than 0.4 after one week were evaluated as "poor", those with a reduced initial stickiness value to 0.4 to 0.6 as "fair", and those with a reduced initial stickiness value to more than 0.6 as "good".

Coatability of the anisotropic conductive films was determined by application to a thickness of 10 to 40 microns at an application speed of 0.5 m/min. and to a length of 50 m and evaluated as "good", when the fluctuation in the film thickness was within 2 microns without any sagging, and as "poor", when the sagging took place and fluctuation in the film thickness exceeded 2 microns.

Dispersibility was determined by microscopic observation and evaluated as "poor", when there were at least 4 occurrences of coagulation in the 1 m-long coating film, and "good", when there 3 or less occurrences of coagulation.

Characteristics of connections obtained by connecting a connection substrate to a further connection substrate or a further connection chip to be connected by anisotropic conductive compositions or films shown in Tables 5 and 6, respectively, are given in Table 7.

An anisotropic conductive composition was printed on conductors on a connection substrate to a thickness of about 20 microns with a width of 2 mm by screen printing. An anisotropic conductive film was slit to a width of 2 mm, wound around a plastic reel, taken out from the reel to a necessary length for bonding, removed of the cover film therefrom, and then stuck tentatively to conductors on the connection substrate to cover the conductor, and a further connection substrate or connection chip to be connected (i.e. LSI, etc.) was placed thereon so as to make alignment of electrodes to others, using a CCD (charge coupled device) camera, followed by application of pressure and heat thereto with a tool to effect bonding.

Connection was carried out at 160° C. for 20 seconds or at 170° C. for 10 seconds, where connection of a substrate to another was carried out at a pressure of 40 kg/cm$^2$, whereas connection of a chip to a substrate was carried out at a pressure of 40 g/bump.

Connection substrates, further connection substrates or chips to be connected, electrodes and chips in combinations as shown in Table 7 were tested to determine the connection resistance, circumferential resistance, insulativeness, substrate adhesion and repairability. Connection resistance was determined by measuring a resistance by a 4-probe method, followed by theoretically subtracting therefrom a circuit resistance up to the connection point.

Circumferential resistance was determined by a 1,000-cycle test between −55° and 125° C., and evaluated as "poor" when the percent change exceeded 20% and as "good" when the percentage charge was below 20%.

Insulativeness was determined by applying a voltage of 100 V between the adjacent electrodes and evaluated as "good" when the insulation resistance was $10^{12}$ Ω or more, and "poor" below $10^{12}$ Ω.

Adhesiveness was expressed as a maximum strength determined by a peel strength test by peeling the film in the vertical direction to the substrate at a rate of 50 mm/minute and evaluated as "good" when the maximum strength was 500 gf/cm or more, and "poor" when it was below 500 gf/cm.

Repairability was determined by mechanically peeling away the film, followed by rubbing the electrodes with an acetone-impregnated cotton swab stick and evaluated as "good" when the electrode surfaces were cleaned at 100 runs of rubbing and "poor" when the rubbing exceeded 100 runs.

Maximum allowable current was evaluated as "good" when the linearity was obtained up to 1.5 A in the voltage-current characteristics and "poor" when no linearity was obtained.

Furthermore, examples of substrates for connection with an anisotropic conductive film stuck thereto are shown in Table 8. Pasting was carried out to a length of 10 mm on connection terminals by a sticking means, while retaining the base film, at a pressure of 5 kgf/cm$^2$ and 60° C. for 5 seconds.

Percent light transmission reduction of substrates for connection as shown in Table 8 was determined by changes in the light transmission before and after the sticking, using a wavelength of 780 nm, and the results are shown in Table 9, where percent reduction of less than 10% was evaluated as "good" and 10% or more as "poor". Furthermore, an alignment fluctuation of 30% or more at the connection to a further connection substrate to be connected was evaluated as "poor" and less than 30% as "good". Voids existing between the terminals at the connection were evaluated as "good" when percent void presence was less than 20% by microscopic observation, and "poor" when it was above 20%.

Comparative Examples

Comparative Examples are shown in Tables 11, 12, 13 and 14, where evaluation was conducted in the same manner as in the Examples.

Industrial Applicability

The present anisotropic conductive composition and film can be used in electrical connections in panels of liquid crystal displays, plasma displays, EL displays, etc., packaging of photo diodes, etc., packaging of LSI onto printed substrates, etc., and so on.

The present application claims the Convention priorities based on Japanese Patent Application No. 8-22767 filed on Feb. 8, 1996 and Japanese Patent Application No.8-159770 filed on Jun. 20, 1996, the contents of which are incorporated in entirety herein by reference.

TABLE 1

| Conductor powder preparation | Average composition (atomic ratio) | | | Surface composition (atomic ratio) | | | Oxygen content (ppm) | Copper compound on particle surfaces | Average particle size (microns) | Percent presence of particles with an average particle size ± 2 μm (%) | Minimum particle size/maximum particle size | Zero-valent Cu + monovalent Cu/ divalent Cu | Si, Ti content (ppm) |
|---|---|---|---|---|---|---|---|---|---|---|---|---|---|
| | Cu | Ag | | Cu | Ag | | | | | | | | |
| A | 0.999 | 0.001 | | 0.99 | 0.01 | | 1200 | yes | 3 | 90 | 0.8 | 0.3 | |
| B | 0.9 | 0.1 | | 0.5 | 0.5 | | 600 | yes | 4 | 85 | 0.4 | 1.0 | |
| C | 0.8 | 0.2 | | 0.3 | 0.7 | | 980 | yes | 5 | 80 | 0.48 | 1.8 | |
| E | 0.7 | 0.3 | | 0.25 | 0.75 | | 900 | yes | 5 | 30 | 0.01 | 5.5 | |
| F | 0.6 | 0.4 | | 0.2 | 0.8 | | 820 | yes | 2 | 33 | 0.05 | 9.8 | 13 |
| | Cu | Au | | Cu | Au | | 960 | yes | 7 | 60 | 0.47 | 2.3 | 0.1 |
| G | 0.8 | 0.2 | | 0.5 | 0.5 | | | yes | | | | | |
| | Cu | Au | Ag | Cu | Au | Ag | 1120 | yes | 10 | 50 | 0.01 | 4.0 | |
| H | 0.7 | 0.1 | 0.2 | 0.4 | 0.2 | 0.4 | | yes | | | | | |
| | Cu | Ag | Pd | Cu | Ag | Pd | 1350 | yes | 2 | 99 | 0.95 | 0.5 | 250 |
| I | 0.8 | 0.18 | 0.02 | 0.6 | 0.38 | 0.02 | | yes | | | | | |
| | Cu | Ag | Ni | Cu | Ag | Ni | 1050 | yes | 5 | 80 | 0.4 | 1.0 | |
| J | 0.7 | 0.25 | 0.05 | 0.5 | 0.48 | 0.02 | | yes | | | | | |
| K | Silver powders | | | Ag 1.0 | | | 150 | — | 5 | 80 | 0.9 | — | 11 |
| L | Nickel powders | | | Ni 1.0 | | | 2000 | — | 5 | 80 | 0.001 | — | |
| | Ni | Au | | Ni | Au | | 3800 | — | 6 | 60 | 0.8 | — | |
| M | 0.9 | 0.1 | | 0.8 | 0.2 | | | | | | | | |
| N | Gold-plated resin powders | | | Au 1.0 | | | — | — | 5 | 90 | 0.98 | — | 550 |
| O | Copper powders | | | Cu 1.0 | | | 12500 | yes | 5 | 60 | 0.48 | 0.02 | |
| | Cu | Ag | | Cu | Ag | | | | | | | | |
| P | 0.999 | 0.001 | | 0.999 | 0.001 | | 10050 | yes | 3 | 90 | 0.8 | 0.01 | |
| Q | 0.001 | 0.999 | | 0.0001 | 0.9999 | | 25 | none | 5 | 90 | 0.45 | — | |
| | Cu | Au | | Cu | Au | | 10 | none | 7 | 60 | 0.47 | — | |
| R | 0.001 | 0.999 | | 0.0001 | 0.9999 | | | | | | | | |

TABLE 2

| | | Organic binder |
|---|---|---|
| | | Expoxy resin |
| (1) | | Bisphenol A type liquid epoxy |
| (2) | | Bisphenol F type liquid epoxy |
| (3) | | Urethane-modified liquid epoxy |
| (4) | | Phenyl glycidyl ether type liquid epoxy |
| (5) | | Polyfunctional polyphenol type liquid epoxy |
| (6) | | Alkyl polyhydric phenol type liquid epoxy |
| (7) | | Alicyclic liquid epoxy |
| (8) | | Cresol-novolack type epoxy resin |
| | | Others |
| (9) | | Phenoxy resin |
| (10) | | Polyurethane resin |
| (11) | | Silicone resin |
| (12) | | SBR resin |
| (13) | | SBS resin |
| (14) | | NBR resin |
| (15) | | Polyvinylbutyral resin |
| (16) | | Polyester resin |
| (17) | | Acrylic resin |
| (18) | | Resol type phenol resin |
| (19) | | Melamine resin |
| (20) | | PPS (polyphenylene sulfide) resin |
| (21) | | PES (polyether sulfone) resin |
| (22) | | Polyphenylene ether resin |
| (23) | | PPO (polypropylene oxide) resin |

TABLE 3

| | | Microcapsule-type curing agent | Average particle size (μ) |
|---|---|---|---|
| (31) | | 2-Ethyl-4-methylimidazole/ bis A-type epoxy compound | 5 |

TABLE 3-continued

| | Microcapsule-type curing agent | Average particle size ($\mu$) |
|---|---|---|
| (32) | 2-Methylimidazole/bis F type epoxy compound | 2 |
| (33) | Imidazole/bisphenol F type epoxy compound | 4 |
| (34) | 2-Methylimidazole/bis A type epoxy compound | 6 |
| (35) | 2-Ethyl-4-methylimidazole/bis F type epoxy compound | 1 |
| (36) | 2-Phenylimidazole/bisphenol A type epoxy compound (Curing agent) | 8 |
| (37) | Dicyandiamide | |
| (38) | Carboxylic acid anhydride | |

TABLE 4

| | Coupling agent |
|---|---|
| (40) | Isopropyltristearyl titanate |
| (41) | Vinyltriethoxysilane |

TABLE 5

Anisotropic conductive composition

| Example No. | Conductive powders (parts by weight) | Organic binder (species)/ parts by weight | | | Curing agent (species)/ parts by weight | | Additive (species)/ parts by weight | Pre-servability |
|---|---|---|---|---|---|---|---|---|
| 1 | A 1 | (4) 3 | (5) 3 | (13) 1 | (31) 2 | (37) 1 | | Good |
| 2 | B 1 | (1) 3 | (9) 3 | | (31) 1.5 | | | Good |
| 3 | B 1 | (1) 0.5 | (9) 0.5 | | (35) 0.3 | | | Good |
| 4 | C 1 | (5) 0.7 | (9) 1 | | (31) 0.7 | | (40) 0.002 | Good |
| 5 | C 1 | (1) 0.2 | (9) 0.2 | (10) 0.1 | (35) 0.15 | | | Fair |
| 6 | D 1 | (7) 6 | (12) 4 | (14) 3 | (31) 3 | (32) 1 | | Good |
| 7 | D 1 | (1) 4 | (6) 1 | (16) 0.5 | (31) 1 | (33) 1 | (40) 0.001 | Good |
| 8 | E 1 | (3) 5 | (11) 1 | (15) 1 | (31) 3 | (38) 0.2 | | Good |
| 9 | E 1 | (3) 6 | (10) 6 | (17) 3 | (31) 3 | (34) 1 | (41) 0.002 | Good |
| 10 | F 1 | (1) 8 | (12) 2 | (20) 0.5 | (31) 4 | (36) 1 | | Good |
| 11 | G 1 | (9) 4 | (10) 2 | | | | | Good |
| 12 | G 1 | (3) 1 | (14) 1 | (19) 0.3 | (32) 0.5 | (38) 0.2 | | Good |
| 13 | H 1 | (7) 7 | (13) 1 | (22) 0.5 | (31) 3 | (36) 1 | | Good |
| 14 | B 1 | (1) 2.5 | (9) 2.8 | | (31) 1.1 | | | Good |
| 15 | I 1 | (1) 0.4 | (9) 0.1 | (23) 0.05 | (32) 0.2 | | | Good |
| 16 | C 1 | (1) 11 | (9) 11 | | (31) 4.5 | | | Fair |
| 17 | J 1 | (2) 4 | (3) 1 | (18) 0.6 | (32) 2 | (37) 1 | | Good |
| 18 | F 1 | (2) 120 | (9) 1 | (10) 0.5 | (33) 20 | | (41) 0.01 | Good |

TABLE 6

Anisotropic conductive film

| Example No. | Anisotropic conductive composition | Coating film thickness (microns) | Base film | Cover film | Coatability | Dispersibility | Preservation stability |
|---|---|---|---|---|---|---|---|
| 19 | Ex.1 | 12 | Alkyd resin-treated PET | Alkyd resin-treated PET | Good | Good | Good |
| 20 | Ex.2 | 10 | Alkyd resin-treated PET | | Good | Good | Good |
| 21 | Ex.3 | 20 | Alkyd resin-treated PET | | Good | Good | Good |
| 22 | Ex.4 | 20 | Silicone resin-treated PET | Polyester | Good | Good | Good |
| 23 | Ex.6 | 40 | Alkyd resin-treated PET | | Good | Good | Good |
| 24 | Ex.8 | 10 | Titanium oxide-containing PET | Alkyd resin-treated PET | Good | Good | Good |
| 25 | Ex.10 | 18 | Silicone resin-treated PET | Teflon | Good | Good | Good |
| 26 | Ex.16 | 20 | Silicone resin-treated PET | Silicone resin-treated PET | Good | Good | Good |
| 27 | Ex.14 | 12 | Si-PET | | Good | Good | Good |
| 28 | Ex.18 | 40 | Titanium oxide-containing PET | Silicone-modified alkyd resin treated PET | Good | Good | Good |

TABLE 7

Characteristics of anisotropic conductive compositions and films

| Example No. | Connection substrate | | Further connection substrate or chip to be connected | |
|---|---|---|---|---|
| | Materials | Electrode | Material | Electrode |
| 1 | Glass | ITO | LSI chip | Au bump |
| 2 | Glass epoxy | Sn-plated Cu | Polyimide | Au-plated Cu |
| 3 | Glass | Al | LSI chip | Au bump |
| 4 | Polyimide | Au-plated Cu | LSI chip | Ni bump |
| 5 | Paper phenol | Solder | Polyimide | Au-plated Cu |
| 6 | Glass epoxy | Sn-plated Cu | Polyimide | Au-plated Cu |
| 7 | Polyimide | Au-plated Cu | LSI chip | Au bump |
| 8 | Glass | Cr-ITO | LSI chip | Au bump |
| 9 | Glass epoxy | Sn-plated Cu | QFP | Cu Ni |
| 10 | Polyphenylene ether | Sn-plated Cu | Polyimide | Au—Ni-plated Cu |
| 11 | Glass epoxy | Sn-plated Cu | Polyimide | Au-plated Cu |
| 12 | Polyurethane | Au-plated Cu | PPS | Au-plated Cu |
| 13 | Epoxy | Au-plated Cu | Polyimide | Sn-plated Cu |
| 14 | Aluminum nitride | Ag–Pt | Aluminum nitride | Ag |
| 15 | Polyacetal | Cu | Polyimide | Sn-plated Cu |
| 16 | Glass epoxy | Cu | Polyimide | Au-plated Cu |
| 17 | Glass polyimide | Au-plated Cu | LSI chip | Cu bump |
| 18 | Glass epoxy | Sn-plated Cu | LSI chip | Solder bump |
| 19 | Glass | ITO | LSI chip | Au bump |
| 20 | Built-up | Sn-plated Cu | LSI chip | Au bump |
| 21 | Glass | Al | LSI chip | Au bump |
| 22 | Built-up | Solder | LSI chip | Au bump |
| 23 | Thermosetting PPE | Au-plated Cu | LSI chip | Au bump |

TABLE 7-continued

Characteristics of anisotropic conductive compositions and films

| | | | | |
|---|---|---|---|---|
| 24 | Low temp. fired substrate | Ag | LSI chip | Solder bump |
| 25 | Silicone | Al | Polyimide | Sn-plated Cu |
| 26 | PPS | Sn-plated Cu | Polyimide | Au-plated Cu |
| 27 | Glass epoxy | Sn-plated Cu | Polyimide | Au-plated Cu |
| 28 | Polyester | Au-plated Cu | Polyester | Cu |

| Example No. | Pitch (microns) | Connection resistance (mΩ) | Circumferential resistance | Insulativeness | Adhesiveness | Repairability | Maximum allowable current |
|---|---|---|---|---|---|---|---|
| 1 | 70 | 40 | Good | Good | Good | Good | Good |
| 2 | 70 | 60 | Good | Good | Good | Good | Good |
| 3 | 50 | 150 | Good | Good | Good | Good | Good |
| 4 | 100 | 60 | Good | Good | Good | Good | Good |
| 5 | 100 | 40 | Good | Good | Good | Good | Good |
| 6 | 120 | 25 | Good | Good | Good | Good | Good |
| 7 | 70 | 70 | Good | Good | Good | Good | Good |
| 8 | 50 | 150 | Good | Good | Good | Good | Good |
| 9 | 300 | 5 | Good | Good | Good | Good | Good |
| 10 | 80 | 55 | Good | Good | Good | Good | Good |
| 11 | 60 | 75 | Good | Good | Good | Good | Good |
| 12 | 80 | 55 | Good | Good | Good | Good | Good |
| 13 | 120 | 20 | Good | Good | Good | Good | Good |
| 14 | 80 | 60 | Good | Good | Good | Good | Good |
| 15 | 100 | 35 | Good | Good | Good | Good | Good |
| 16 | 50 | 200 | Good | Good | Good | Good | Good |
| 17 | 120 | 15 | Good | Good | Good | Good | Good |
| 18 | 100 | 60 | Good | Good | Good | Good | Good |
| 19 | 100 | 58 | Good | Good | Good | Good | Good |
| 20 | 80 | 90 | Good | Good | Good | Good | Good |
| 21 | 60 | 70 | Good | Good | Good | Good | Good |
| 22 | 110 | 50 | Good | Good | Good | Good | Good |
| 23 | 80 | 80 | Good | Good | Good | Good | Good |
| 24 | 100 | 95 | Good | Good | Good | Good | Good |
| 25 | 100 | 105 | Good | Good | Good | Good | Good |
| 26 | 50 | 220 | Good | Good | Good | Good | Good |
| 27 | 100 | 30 | Good | Good | Good | Good | Good |
| 28 | 70 | 190 | Good | Good | Good | Good | Good |

TABLE 8

Substrate for connection with an anisotropic conductive film stuck thereto

| Example No. | Anisotropic conductive film | Film width | Substrate for connection to be stuck | | |
|---|---|---|---|---|---|
| | | | Materials | Conductor circuit | Pitch (microns) |
| 29 | Example 20 | 1 mm | Polyimide film | Au-plated Cu | 300 |
| 30 | Example 21 | 2 mm | Polyester film | Sn-plated Cu | 70 |
| 31 | Example 20 | 1.5 mm | Polyimide film | Au-plated Cu | 50 |

TABLE 9

Evaluation of substrate for connection

| Substrate for connection | Percent light transmission reduction (%) | Further connection substrate to be connected | | Connection conditions (no tentative pressing) | | | Connection characteristics | |
|---|---|---|---|---|---|---|---|---|
| | | Materials | Conductor circuit | Pitch (microns) | Temp. (° C.) | Pressure (kg/cm²) | Time (s) | Connection fluctuation | Perccent void (%) |
| Example 29 | <10 | Glass | Al | 250 | 160 | 40 | 15 | Good | <20 |
| Example 30 | <10 | Glass | ITO | 70 | 150 | 30 | 10 | Good | <20 |
| Example 31 | <10 | Glass | Ag | 200 | 170 | 30 | 15 | Good | <20 |

TABLE 10

Anisotropic conductive composition

| Comp. Ex. No. | Conductive powders (parts by weight) | Organic binder (species)/ parts by weight | | Curing agent (species)/ parts by weight | Additive (species)/ parts by weight | Preservability |
|---|---|---|---|---|---|---|
| 1  | K 1 | (1) 3   | (10) 3  | (31) 1   |             | Good |
| 2  | L 1 | (1) 4   | (9) 1   | (31) 4.5 |             | Good |
| 3  | N 1 | (1) 8   | (9) 8   | (32) 4   |             | Good |
| 4  | M 1 | (1) 7   | (10) 1  | (12) 1 (31) 3 | (40) 0.002 | Good |
| 5  | O 1 | (1) 3   | (9) 2   | (10) 1 (35) 1.5 |       | Poor |
| 6  | A 1 | (1) 0.2 | (12) 0.1| (31) 0.1 |             | Good |
| 7  | B 1 | (1) 200 | (10) 60 | (14) 3 (31) 40 |         | Good |
| 8  | P 1 | (1) 5   | (12) 1  | (31) 2   |             | Poor |
| 9  | Q 1 | (1) 5   | (12) 1  | (31) 2   |             | Good |
| 10 | R 1 | (1) 5   | (12) 1  | (31) 2   |             | Good |

TABLE 11

Anisotropic conductive film

| Comp. Ex. No. | Anisotropic conductive composition | Coating film thickness (microns) | Base film | Cover film | Coatability | Dispersibility | Preservation stability |
|---|---|---|---|---|---|---|---|
| 11 | Comp. Ex. 1  | 12 | Alkyd resin-treated PET | Alkyd resin-treated PET | Good | Good | Good |
| 12 | Comp. Ex. 2  | 20 | Silicone resin-treated PET | Silicone resin-treated PET | Poor | Poor | Good |
| 13 | Comp. Ex. 3  | 30 | Alkyd resin-treated PET |  | Good | Good | Good |
| 14 | Comp. Ex. 4  | 20 | Silicone resin-treated PET | Polyester | Good | Good | Good |
| 15 | Comp. Ex. 5  | 40 | Alkyd resin-treated PET |  | Good | Good | Good |
| 16 | Comp. Ex. 6  | 10 | Titanium oxide-containing PET | Alkyd resin-treated PET | Poor | Poor | Good |
| 17 | Comp. Ex. 7  | 18 | Silicone resin-treated PET | Teflon | Good | Good | Good |
| 18 | Comp. Ex. 8  | 13 | Alkyd resin-treated PET |  | Poor | Poor | Poor |
| 19 | Comp. Ex. 9  | 10 | Silicone resin-treated PET |  | Poor | Poor | Good |
| 20 | Comp. Ex. 10 | 10 | Alkyd resin-treated PET |  | Poor | Poor | Good |

TABLE 12

Characteristics of anisotropic conductive compositions and films

| Example No. | Connection substrate Material | Connection substrate Electrode | Further connection substrate or chip to be connected Material | Further connection substrate or chip to be connected Electrode |
|---|---|---|---|---|
| 1 | Glass | ITO | LSI chip | Au bump |
| 2* | Glass epoxy | Au-plated Cu | Polyimide | Sn-plated Cu |
| 3* | Glass | Al | LSI chip | Au bump |
| 4 | Polyimide | Au-plated Cu | LSI chip | Ni bump |
| 5 | Glass epoxy | Sn-plated Cu | Polyimide | Au-plated Cu |
| 6 | Glass epoxy | Sn-plated Cu | Polyimide | Au-plated Cu |
| 7 | Polyimide | Au-plated Cu | LSI chip | Au bump |
| 8 | Glass | Cr-ITO | LSI chip | Au bump |
| 9 | Glass epoxy | Sn-plated Cu | QFP | Cu Ni |
| 10 | Polyphenylene ether | Sn-plated Cu | Polyimide | Au-plated Cu |
| 11 | Glass epoxy | Sn-plated Cu | Polyimide | Au-plated Cu |
| 12* | Glass epoxy | Au-plated Cu | Polyimide | Au-plated Cu |
| 13* | Glass epoxy | Au-plated Cu | Polyimide | Sn-plated Cu |
| 14 | Glass | ITO | Polyimide | Sn-plated Cu |
| 15 | Glass epoxy | Au-plated Cu | Polyimide | Sn-plated Cu |
| 16 | Glass epoxy | Au-plated Cu | Polyimide | Au-plated Cu |
| 17 | Glass polyimide | Au-plated Cu | LSI chip | Cu bump |
| 18 | Glass epoxy | Sn-plated Cu | LSI chip | Au bump |
| 19 | Glass | ITO | LSI chip | Au bump |
| 20 | Built-up | Sn-plated Cu | LSI chip | Au bump |

| Example No. | Pitch (microns) | Connection resistance (mΩ) | Circumferential resistance | Insulativeness | Adhesiveness | Repairability | Maximum allowable current |
|---|---|---|---|---|---|---|---|
| 1 | 70 | 60 | Good | Poor | Good | Good | Good |
| 2* | 100 | 3800 | Poor | " | " | " | Poor |
| 3* | 50 | 2100 | " | Good | " | " | " |
| 4 | 100 | 2500 | Fair | Fair | " | " | " |
| 5 | 100 | 4000 | Poor | Good | " | " | " |
| 6 | 120 | 1000 | " | Poor | Poor | Poor | " |
| 7 | 70 | 1200 | Good | Good | Good | Good | " |
| 8 | 50 | 2400 | Poor | " | " | " | " |
| 9 | 300 | 10 | Good | Poor | " | " | Good |
| 10 | 80 | 35 | " | " | " | " | " |
| 11 | 60 | 50 | " | " | " | " | " |
| 12* | 100 | 3800 | Poor | " | " | " | Poor |
| 13* | 100 | 2100 | " | Good | " | " | " |
| 14 | 100 | 2300 | Fair | Fair | " | " | " |
| 15 | 100 | 4000 | Poor | Good | " | " | " |
| 16 | 80 | 1000 | " | Poor | Poor | Poor | " |
| 17 | 130 | 800 | Good | Good | Good | Good | " |
| 18 | 130 | 1100 | Poor | " | " | " | " |
| 19 | 60 | 700 | Good | Poor | " | " | Good |
| 20 | 80 | 1200 | " | " | " | " | " |

TABLE 13

Substrate for connection with an anisotropic conductive film stuck thereto

| Comp. Ex. No. | Anisotropic conductive film | Film width | Substrate for connection to be stuck Material | Substrate for connection to be stuck Conductor circuit | Substrate for connection to be stuck Pitch (microns) |
|---|---|---|---|---|---|
| 21 | Comp. Ex. 2 | 1 mm | Polyimide film | Au-plated Cu | 300 |

TABLE 14

| | | Evaluation of substrate for connection | | | | | | | |
|---|---|---|---|---|---|---|---|---|---|
| | Percent light | Further connection substrate to be connected | | | Connection conditions (no tentative pressing) | | | Connection characteristics | |
| Substrate for connection | transmission reduction (%) | Materials | Conductor circuit | Pitch (microns) | Temp. (° C.) | Pressure (kg/cm²) | Time (s) | Connection fluctuation | Perccent void (%) |
| Comp. Ex. 21 | 40 | Glass | Al | 250 | 160 | 40 | 15 | Poor | 50 |

What is claimed is:

1. An anisotropic conductive composition, which comprises:

1 part by weight of copper alloy powders having an oxygen content of 10 to 10,000 ppm; and 0.5 to 250 parts by weight of an organic binder, wherein a copper oxide and/or a copper hydroxide exists on the surfaces of particles of the copper alloy powders.

2. An anisotropic conductive composition according to claim 1, wherein the copper alloy powders have a composition represented by the general formula:

$$M_xCu_{1-x}$$

(where M is at least one member selected from the group consisting of Ag and Au and x is in an atomic ratio of $0.001 \leq x \leq 0.6$).

3. An anisotropic conductive composition according to claim 2, wherein a silver concentration on the surfaces of particles of the copper alloy powders is higher than the average silver concentration throughout the copper alloy powders, the copper alloy powders have an average particle size $D_{ave}$ of 2 to 15 microns and the powders having particle sizes in a range of $D_{ave} \pm 2$ microns are in a proportion of 30 to 100% by volume.

4. An anisotropic conductive composition according to claim 1, wherein the copper compound contains one member selected form the group consisting of monovalent and divalent copper oxides, and copper hydroxides.

5. An anisotropic conductive composition according to claim 4, wherein a ratio of the amount of the zero-valent copper and the monovalent copper to the amount of the divalent copper is at least 1.

6. An anistropic conductive composition according to claim 1, wherein a ratio of minimum particle size $D_{min}$ to maximum particle size $D_{max}$, of the copper alloy powders, is from 0.001 to less than 0.5.

7. An anisotropic conductive composition according to claim 1, wherein the surfaces of the copper alloy powders are treated with at least one coupling agent selected from the group consisting of a titanium coupling agent, a silane coupling agent and an alumina coupling agent, and the surfaces of the powders have 0.1 to 500 ppm of at least one member selected from the group consisting of Ti and Si.

8. An anisotropic conductive composition according to claim 1, wherein the organic binder comprises epoxy resin and contains 5 to 250 parts by weight of a microcapsule-type curing agent as a curing agent per 100 parts by weight of the epoxy resin.

9. An anisotropic conductive composition according to claim 1, wherein the organic binder comprises epoxy resin and contains 1 to 250 parts by weight of at least one member selected from the group consisting of phenoxy resin, polyester resin, acrylic rubber, SBR, NBR, silicone resin, SBS, polyvinylbutyral resin, polyurethane resin and their derivatives per 100 parts by weight of the epoxy resin.

10. An anisotropic conductive composition according to claim 8, wherein the microcapsule-type curing agent has an average particle size of 1 to 10 microns.

11. An anisotropic conductive film, which comprises a film of an anisotropic conductive composition according to claim 1.

12. A substrate for connection comprising:

an insulating substrate;

a conductor circuit provided thereon;

connection terminals leading to said conductor circuit; and an anisotropic conductive film according to claim 11 which is attached to said connection terminals.

13. An anisotropic conductive composition comprising one part by weight of copper alloy powders and 0.5 to 250 parts by weight of an organic binder, wherein a copper compound having an oxygen content of 10 to 10,000 ppm exists on the surfaces of particles of the copper alloy powders.

* * * * *